(12) United States Patent
Catala

(10) Patent No.: US 6,504,434 B2
(45) Date of Patent: Jan. 7, 2003

(54) METHOD FOR CONFIGURING LOW-NOISE INTEGRATED AMPLIFIER CIRCUITS

(75) Inventor: Stephane Catala, Ismaning (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/036,049

(22) Filed: Dec. 31, 2001

(65) Prior Publication Data
US 2002/0125953 A1 Sep. 12, 2002

Related U.S. Application Data

(63) Continuation of application No. PCT/DE00/01757, filed on May 30, 2000.

(30) Foreign Application Priority Data

Jun. 30, 1999 (DE) ......................................... 199 30 194

(51) Int. Cl.$^7$ ................................................. H03F 3/60
(52) U.S. Cl. ........................................ 330/286; 330/302
(58) Field of Search ............................. 330/2, 286, 302

(56) References Cited

U.S. PATENT DOCUMENTS 5,406,226 A * 4/1995 Cioffi et al. ................ 330/286
6,023,197 A * 2/2000 Ter Laak et al. ........... 330/302

OTHER PUBLICATIONS

Gray, Paul, R.: "Analysis and design of analog integrated circuits", John Wiley & Sons, Inc., New York, NY, 1993, pp. 36, 39, 776–777.
Czylwik, Andreas: "Theoretische grenzen für Anpassungsnetzwerke in optischen Empfängern", Frequenz, vol. 49, 1995, No. 3–4, pp. 58–65.

* cited by examiner

Primary Examiner—Robert Pascal
Assistant Examiner—Khanh Van Nguyen
(74) Attorney, Agent, or Firm—Laurence A. Greenberg; Werner H. Stemer; Ralph E. Locher

(57) ABSTRACT

A method for configuring low-noise integrated amplifier circuits having an input stage with a transistor includes noise matching the circuit to the real part of a predetermined output impedance of a transfer element connected upstream of the circuit by a choice of process parameters during the production of the circuit and/or of geometry parameters of the integrated components and/or dimensioning the component values of the circuit, the noise figure of the circuit, dependent on a real generator resistance, is less than a predetermined figure in a range wherein the value of the output impedance real part also lies. The required power matching of the input impedance of the circuit to the output impedance is performed by choosing the effective load on a transistor collector to produce a complex voltage gain that, due to the Miller effect, generates an input impedance equal to the complex conjugate of the predetermined output impedance.

7 Claims, 2 Drawing Sheets

METHOD FOR CONFIGURING LOW-NOISE INTEGRATED AMPLIFIER CIRCUITS

CROSS-REFERENCE TO RELATED APPLICATION

This application is a continuation of copending International Application No. PCT/DE00/01757, filed May 30, 2000, which designated the United States.

BACKGROUND OF THE INVENTION

FIELD OF THE INVENTION

The invention relates to a method for configuring low-noise integrated amplifier circuits.

To use prior art integrated low-noise amplifiers, the user has to develop a matching circuit that optimally matches the input impedance of the low-noise amplifier to the output impedance of the preceding stage or of the preceding transfer element. Such a configuration minimizes the reflection of the power at the input of the low-noise amplifier.

Respective $\pi$ equivalent circuit diagrams of a bipolar transistor are specified on pages 36 and 39 of the document Gray, Paul "Analysis and Design of Analog Integrated Circuits". The calculation of the noise properties of such a transistor is explained on page 776 et seq.

The document "Theoretische Grenzen für Anpassungsnetzwerke in optischen Empfängern (Teil II)" [Theoretical Limits for Matching Networks in Optical Receivers (Part II)], A. Czylwik, Frequenz, Vol. 49, No. 3/04, pages 58 to 65, specifies a method for power and noise matching of a field-effect transistor to a photodiode.

Depending on the noise properties of the amplifier, however, it has not been possible to ensure that the noise figure of the amplifier is less than a predetermined value for the noise figure.

Moreover, the realization and dimensioning of the matching circuit by external components means an additional outlay with respect to the circuitry of the integrated low-noise amplifier.

SUMMARY OF THE INVENTION

It is accordingly an object of the invention to provide a method for configuring low-noise integrated amplifier circuits that overcomes the hereinafore-mentioned disadvantages of the heretofore-known devices and methods of this general type and that requires no additional external circuitry when using the amplifier circuit.

With the foregoing and other objects in view, there is provided, in accordance with the invention, a method for producing a low-noise integrated amplifier circuit including the steps of providing an integrated amplifier circuit having an input stage with one of the group consisting of a common-emitter bipolar transistor and a common-source field-effect transistor, each transistor having a collector with an effective load, the amplifier circuit having an input impedance, a noise figure, and integrated components with component values, connecting a transfer element upstream with respect to the amplifier circuit, the transfer element having a predetermined output impedance with a real part, and dimensioning the amplifier circuit by (a) noise matching the amplifier circuit to the real part of the predetermined output impedance of the transfer element by determining a range of resistances in which the noise figure of the amplifier circuit is less than a predetermined noise figure by at least one of the group consisting of first defining process parameters during the production of the amplifier circuit, first defining geometry parameters of at least one of the integrated components of the amplifier circuit, a dimensioning of the component values, and first defining one of a collector current and a drain current, the noise figure of the amplifier circuit being dependent on a real generator resistance, and by determining a value of the real part of the predetermined output impedance lying in the range, and, for the first definition of the parameters of the amplifier circuit, determining a minimum noise figure and an associated optimum generator resistance and realizing the amplifier circuit with the associated parameters if the minimum noise figure is less than or equal to the predetermined noise figure and the optimum generator resistance corresponds, within predetermined tolerances, to the real part of the predetermined output impedance, otherwise performing a new definition of the parameters, replacing the first definition, with other parameters deviating from the first definition, and (b) subsequently, power matching the input impedance of the amplifier circuit to the predetermined output impedance by selecting the effective load on the collector of the transistor to produce a complex voltage gain generating, due to the Miller effect, an input impedance equal to a complex conjugate of the predetermined output impedance.

The invention is based on the insight that, by the definition of different parameters (such as process parameters during the production of the integrated low-noise amplifier and/or geometry parameters of one or more components of the amplifier and/or component values of the amplifier and/or the collector current or the drain current) "noise matching" to a predetermined output impedance of a preceding transfer element can be achieved when the parameters are chosen such that the noise figure $F(R_G)$ of the amplifier (the noise figure being dependent on the real part of a complex generator impedance) is less than a predetermined desired value Fdesired for the noise figure in a range in which the real part of the predetermined output impedance of an arbitrary transfer element connected upstream of the amplifier also lies. Strictly speaking, genuine noise matching would be given only when the value of the real generator resistance, at the minimum of the profile of the noise figure of the amplifier as a function of the real generator resistance, corresponds to the real part of the output impedance of the preceding transfer element. The following description will address noise matching even when such a condition is only approximately satisfied.

If the above-mentioned parameters are chosen to give noise matching, then, according to the invention, the effective load on the collector or the drain of the transistor of the input stage of the amplifier is chosen to produce an amplifier input impedance that is substantially equal to the complex conjugate of the output impedance of the preceding transfer element. For example, power matching is performed by the choice of the load. In such a case, the invention exploits the Miller effect, according to which the collector-base capacitance or the drain-gate capacitance that is multiplied by the voltage gain, in the emitter circuit of a bipolar transistor or in the source circuit of a field-effect transistor, concomitantly determines the input capacitance of the amplifier circuit.

Because the voltage gain is generally a complex quantity that only depends on the (complex) load on the collector or the drain of the transistor of the input stage and, if appropriate, on the inductance (or the impedance) at the emitter or the source, the input impedance is able not only to be altered in terms of magnitude but also to be rotated within certain limits in the complex plane so that, by the suitable choice of the load in (nevertheless relatively wide) limits, the input impedance of the amplifier can be determined such that it corresponds to the complex conjugate of the output impedance of the preceding transfer element.

The intensity of the Miller effect has practically no influence on the input-related noise sources in the noise equivalent circuit diagram of the amplifier circuit. In other words, the noise matching and the power matching can be performed substantially independently of one another by the method according to the invention.

According to an embodiment of the method according to the invention, the noise matching is performed in a first step and the power matching is performed in a subsequent second step. Such a procedure has the advantage of lower complexity because a plurality of quantities have to be taken into account in the noise matching and the power matching can be effected only by a corresponding choice of the load as single quantity.

According to another embodiment of the method according to the invention, firstly a set (that preferably appears expedient) of the crucial parameters are chosen for noise matching. With these parameters, the minimum noise figure $F_{opt}$ and the associated optimum real generator resistance $R_{opt}$ are then determined. The determination can be effected, of course, using simplified approximation relationships or using analytical or numeral simulation methods. If these quantities correspond to the specifications for the permissible noise figure and the real part of the output impedance of the preceding stage, then the method can be continued with the implementation of the power matching.

It goes without saying, however, that it is also possible to attempt to modify the parameter values to obtain an even lower optimum noise figure and even better correspondence between the real optimum generator resistance and the real part of the complex output impedance.

In accordance with another mode of the invention, the noise figure or the optimum noise figure and the generator resistance or the optimum generator resistance, for an input stage with a bipolar transistor, are calculated to an approximation as a function of the base bulk resistance and the collector current. In a corresponding manner, the parameters gate-source capacitance and drain current can be used for an input stage with a field-effect transistor.

In accordance with a further mode of the invention, for an input stage with a field-effect transistor, the noise figure is calculated dependent upon at least one parameter of the group consisting of the generator resistance, the optimum noise figure, and the optimum generator resistance as a function of a gate-source capacitance and a drain current.

In accordance with an added mode of the invention, for a common-emitter bipolar transistor, the optimum noise figure $F_{opt}$ and the optimum generator resistance $R_{opt}$ are calculated with the following two approximation relationships:

$$R_{sopt} \approx \frac{\sqrt{\beta_F}}{g_m} \sqrt{1 + 2g_m r_b} \quad F_{opt} \approx 1 + \frac{1}{\sqrt{\beta_F}} \sqrt{1 + 2g_m r_b},$$

where $\beta_F$ designates a DC gain of the transistor, $r_b$ designates the base bulk resistance, and $g_m$ designates the transistor transconductance and the following holds true for $g_m$: $g_m = eI_c/kT$, where e designates the charge of an electron, k designates Boltzmann's constant, T designates the absolute temperature, and $I_c$ designates the collector current.

In accordance with a concomitant mode of the invention, the power matching for a common-emitter bipolar transistor with an emitter inductance $L_e$ and a load including a series circuit formed by a capacitance $C_L$ and a non-reactive resistance $R_L$ is determined with the following relationships:

$$X_L = |1 + g_m X_e \tan\Phi|\cos\Phi \frac{X_\mu}{g_m^* |Z_E|}$$

$$R_L = \tan[\arctan(X_e g_m) - \Phi] \cdot X_L - \frac{X_\mu}{g_m \cdot X_\pi}$$

where $X_e$ designates the reactance $X_e = j\omega L_e$ of the emitter inductance, $X_\mu$ designates the reactance of the collector-base capacitance $X_\mu = -j/\omega C_\mu$, $g_m$ designates the transconductance of the transistor, $|Z_E|$ designates the magnitude, $\Phi$ designates the phase of the target input impedance $Z_e = |Z_E| \cdot e^{j\Phi}$, and $X_\pi$ designates the base-emitter impedance in a $\pi$ equivalent circuit diagram of the bipolar transistor.

Other features that are considered as characteristic for the invention are set forth in the appended claims.

Although the invention is illustrated and described herein as embodied in a method for configuring low-noise integrated amplifier circuits, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
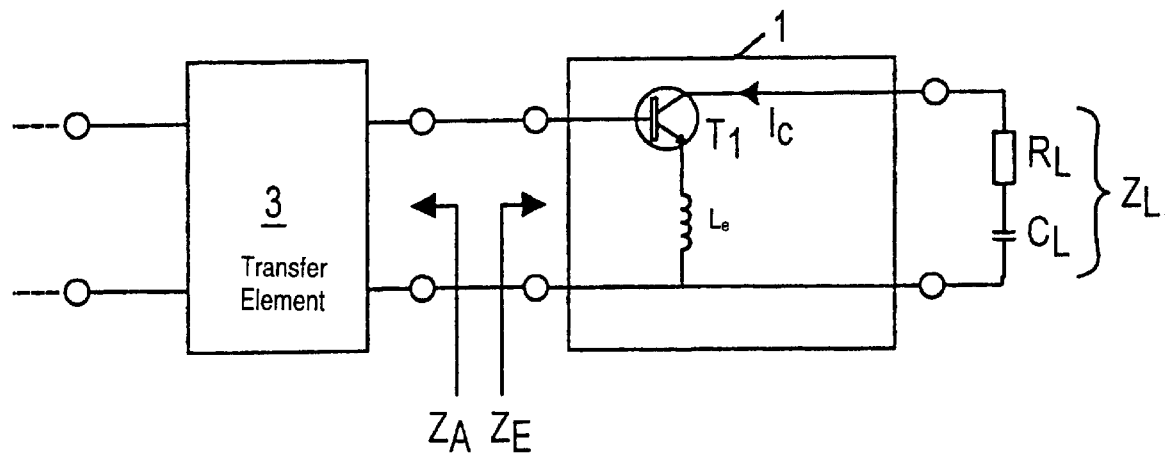
FIG. 1 is a schematic and block circuit diagram of a low-noise amplifier with a load $Z_L$ connected downstream of an arbitrary preceding transfer element according to the invention.

Referring now to the figures of the drawings in detail and first, particularly to FIG. 1 thereof, there is shown a diagrammatic illustration of a low-noise amplifier 1 that is connected downstream of an arbitrary transfer element 3. In the simplified illustration in accordance with FIG. 1, the amplifier includes only one stage having a common-emitter bipolar transistor $T_1$. However, the bipolar transistor can also be replaced by a common-source field-effect transistor of any desired type, to which the following explanations apply accordingly, in which case, of course, the respective parameters of the bipolar transistor then have to be replaced by the corresponding parameters of the field-effect transistor.

The emitter circuit is connected at the output to a complex load $Z_L$, which may include, for example, a series circuit formed by a real resistor $R_L$ and a capacitor $C_L$. The special case of a complex load was chosen in FIG. 1 because, through such a choice, by exploiting the Miller effect and customary properties of integrated transistors, it is possible to achieve a rotation of the input impedance $Z_E$ onto the real axis (cf. below). Such is a frequent requirement when using low-noise amplifiers that have to be power-matched to a real characteristic impedance of, for example, 50 Ω.

However, the complex load $Z_L$ is always the load that effectively occurs on the collector of the transistor of the input stage and includes the reaction from downstream integrated transfer elements of any desired type, for example, downstream amplifier stages, and also an external load.

The inductance $L_e$ at the emitter of the transistor $T_1$ is, in practice, effected by a bonding wire that is usually present and connects the emitter to the ground terminal.

In the configuration of the amplifier circuit 1, on one hand, it is necessary regularly to satisfy the requirement that the noise figure F of the amplifier circuit is less than a predetermined value $F_{desired}$. On the other hand, to avoid reflections at the input of the amplifier circuit 1, it is necessary to perform power matching to the preceding transfer element 3. In other words, the output impedance $Z_A$ of the preceding transfer element must be equal to the complex conjugate of the input impedance $Z_E$ of the amplifier circuit.

Figure 2:
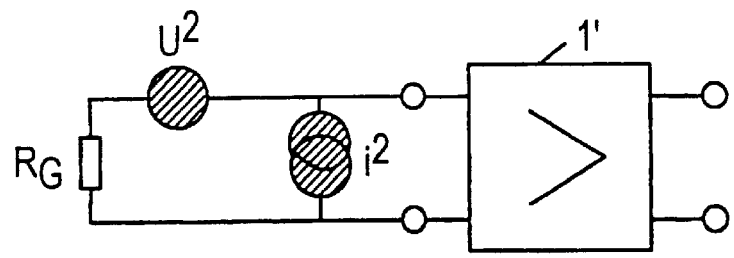
FIG. 2 is a block circuit diagram of a noise equivalent circuit diagram of an amplifier according to the invention.

In practice, the noise figure of the amplifier circuit is dependent, in particular, on the base bulk resistance $r_b$ and on the collector current $I_c$ of the transistor $T_1$ of the input stage of the amplifier circuit when the transistor $T_1$ is configured as a bipolar transistor, and on the gate-source capacitance $C_{GS}$ and the drain current when the transistor $T_1$ is configured as a field-effect transistor, and also on the real generator resistance $R_G$ in the noise equivalent circuit diagram of the low-noise amplifier. See FIG. 2. In such a case, the amplifier 1 is interpreted as an ideal non-noisy amplifier 1'. The noise properties are determined by the two noise sources (shown hatched) in the form of a noise voltage source with the fluctuation square of the noise voltage $u^2$ and in the form of a noise current source with the fluctuation square of the noise current $i^2$.

Figure 3:
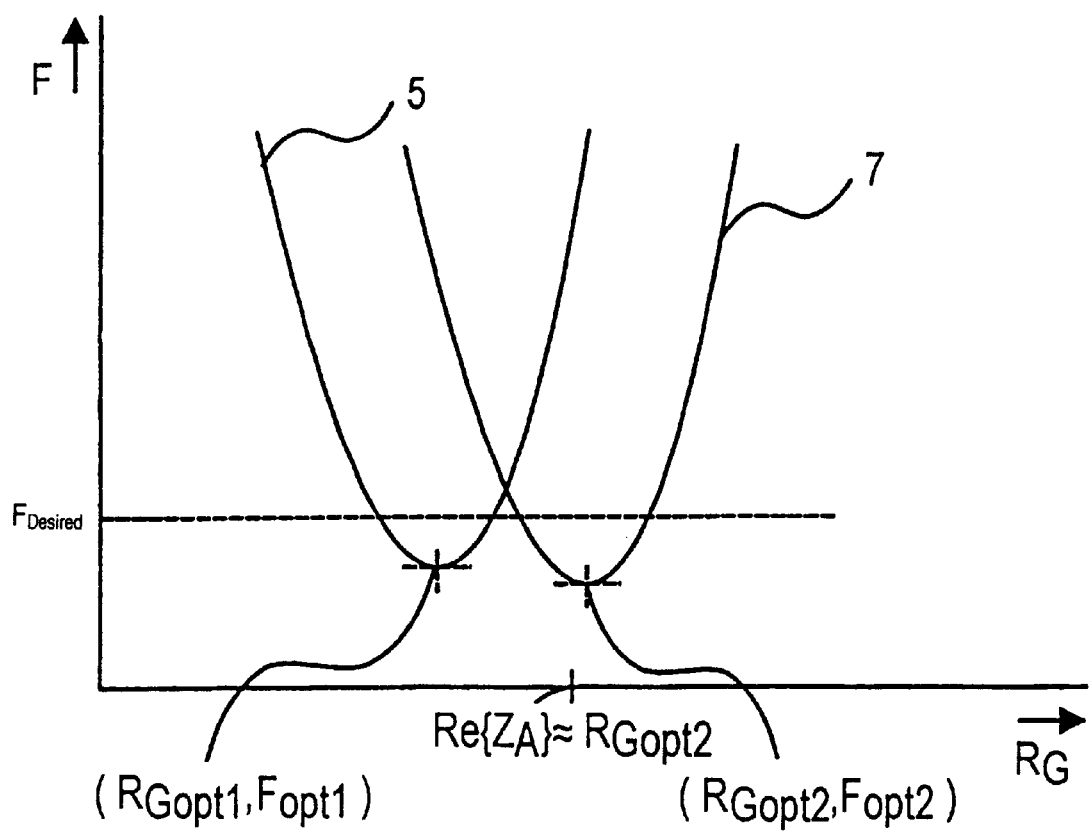
FIG. 3 is graph illustrating the dependence of the noise figure F of an amplifier on the real part $R_G$ of a complex generator impedance according to the invention.

For customary transistors, there results a dependence of the noise figure F on the real part $R_G$ of a complex generator impedance $Z_G$, as illustrated diagrammatically in FIG. 3.

Moreover, the noise figure is quite generally dependent on the susceptance of the generator impedance as well. For a MOS field-effect transistor, there results here, for example, an approximately parabolic profile, in which case, at least when there is a lack of correlation of the two noise sources, the minimum noise figure occurs if the input susceptance of the amplifier is equal to the negative susceptance of the generator impedance, i.e., if tuning occurs. As a result, the influence of the reactive component of the generator impedance on the noise figure can be ignored at least to an approximation if the amplifier is to be dimensioned or operated in a power-matched manner.

According to the invention, a set of values for those parameters that influence the noise figure is first chosen for the construction of the amplifier circuit. The selection quite generally involves process parameters in the realization of the corresponding integrated circuit, geometry parameters for the components of the circuit, and component values.

The selection results in dependencies for the noise figure F as illustrated in FIG. 3. If one were to consider, e.g., the curve 5 with a minimum at the point ($R_{Gopt1}$, $F_{opt1}$) then the requirement $F \leq F_{desired}$ can be satisfied for the range for the generator resistance $R_G$ that lies between the two points of intersection of the curve 5 with the horizontal straight line $F=F_{desired}$. If the condition cannot be satisfied, i.e., if the curve for $F=F(R_G)$ lies completely above the straight line $F=F_{desired}$, then it is always necessary to choose a new set of values for the parameters that influence the dependence of the noise figure on the generator resistance.

If the condition $F(R_G) \leq F_{desired}$ can be satisfied, then it is furthermore necessary to satisfy the condition $R_G \approx Re\{Z_E\}$, so that the overall result is noise matching.

If such a condition cannot be satisfied, then, at this point it is necessary to choose a new set of values for the relevant parameters.

By way of example, a situation might arise wherein, although the condition $F \leq F_{desired}$ can be satisfied with a specific set of values for the parameters to be chosen, the real part of the predetermined output impedance $Z_A$ does not lie within the range for $R_G$ between the points of intersection of the curve 5 with the straight line $F_{desired}$. In such a case, noise matching cannot be achieved for the chosen set of values for the parameters. By contrast, if the curve 7 with the minimum at the point ($R_{Gopt2}$, $F_{opt2}$) in FIG. 3 is obtained with a newly chosen set of values, then a range shifted toward the right results for a permissible range for a permissible generator resistance $R_G$.

If the real part of the predetermined output impedance lies in such a range, then the first method step can be ended. If such is not the case, then another set of values for the parameters must again be chosen.

However, even for the case wherein both the condition $F(R_G) \leq F_{desired}$ and the condition $RG \approx Re\{Z_E\}$ can be satisfied, it is possible to attempt to find a better set of values for the parameters. In particular, it is advantageous for the optimum generator resistance $R_{Gopt}$ to correspond as far as possible to the real part of the predetermined output impedance $Z_A$. The correspondence is desired because the gradient of the curve $F(R_G)$ is equal to zero at this point and the gradient of the curve is relatively small in the vicinity of this point, so that, e.g., manufacturing fluctuations that can bring about a slight shift of the curve $F(R_G)$ both in the direction of the abscissa and in the direction of the ordinate have only a relatively small effect on the noise figure F. In other words, during operation of an amplifier that has such a dependence of the noise figure F on the generator resistance $R_G$, with a generator resistance (which is equal to the real part of the output impedance $Z_A$ of the preceding transfer element) deviating slightly from the optimum generator resistance $R_G$, there results only a slightly higher noise figure than in the case of optimum "noise matching".

In a next step, the power matching of the low-noise amplifier can then be performed. The matching is effected according to the invention by a corresponding choice of the load $Z_L$ on the collector of the input transistor $T_1$, i.e., by a corresponding definition of the voltage gain of the input stage. In such a case, the effect whereby a complex load $Z_L$ influences the input impedance $Z_E$ as a result of the Miller effect is exploited. The Miller effect, known per se, is brought about by the parasitic collector-base capacitance (bipolar transistor) or the drain-gate capacitance (field-effect transistor), the parasitic capacitance, multiplied by the voltage gain, being superposed on the input capacitance between base and emitter, or between gate and source.

Because the voltage gain can be interpreted as exclusively load-dependent and can also be complex, it is possible to rotate the input impedance by a corresponding choice of the load $Z_L$ in relatively wide limits both in terms of magnitude and in its direction in the complex plane. In such a case, a frequent task will lie in matching the input impedance to a purely real output resistance of the preceding transfer element.

The invention, therefore, exploits the fact that although altering the load affects the input impedance, it leaves the noise properties of the amplifier circuit unaffected to the greatest possible extent. Thus, the noise matching achieved in the previously explained step is not affected by alteration of the load for the purpose of achieving power matching.

The method is explained below using relationships that are simplified to the greatest possible extent, i.e., a highly simplified model for describing the properties of a bipolar transistor is used. It goes without saying, however, that the method can also be carried out correspondingly using more complicated models that only permit complicated analytical or numerical solutions.

As mentioned above, the noise figure F dependent on the generator resistance $R_G$ is determined, in the case of the configuration of the transistor $T_1$, substantially by the base bulk resistance $r_b$ and the collector current $I_c$ and, thus, by the transconductance $g_m$ of the transistor $T_1$. In such a case, the following relationship holds true for the transconductance: $g_{m=e/kT\cdot I_c}$, where e designates the charge of an electron, T designates the absolute temperature, and k designates Boltzmann's constant.

For the optimum noise figure and the optimum generator resistance, the following relationships hold true to an approximation:

$$R_{sopt} \approx \frac{\sqrt{\beta_F}}{g_m}\sqrt{1+2g_mr_b} \quad F_{opt} \approx 1+\frac{1}{\sqrt{\beta_F}}*\sqrt{1+2g_mr_b}$$

As a result, the optimum operating point of the curve $F(R_G)$ can be determined at least to an approximation for specific values for $r_b$ and $I_c$.

For the exemplary embodiment of an amplifier with a bipolar transistor according to FIG. 1, with a load including a resistor $R_L$ and a capacitor $C_L$ with the reactance $X_L=-j/\omega C_L$, the following relationships result to a first approximation for achieving an input impedance $Z_E=|Z_E|\cdot e^{j\Phi}$:

$$X_L = |1+g_mX_e\tan\Phi|\cdot\cos\Phi\cdot\frac{X_\mu}{g_m\cdot|Z_E|}$$

$$R_L = \tan[\arctan(X_eg_m)-\Phi]\cdot X_L - \frac{X_\mu}{g_m\cdot X_\pi}$$

In such a case, $X_e$ designates the reactance $X_e=j\omega L_e$ of the emitter inductance, $X_\mu$ designates the reactance of the collector-base capacitance $X_\mu=-j/\omega C_\mu$, $g_m$ designates the already known transconductance of the transistor, $|Z_E|$ designates the magnitude, $\phi$ designates the phase of the target input impedance $Z_E=|Z_E|\cdot e^{j\Phi}$, and $X_\pi$ designates the base-emitter impedance in a $\pi$ equivalent circuit diagram of the bipolar transistor.

For a desired real input impedance $Z_E$, i.e., if $\phi=0$ holds true, $X_L$ turns out to be $X_L=X_\mu/g_m|Z_E|$ and $R_L$ correspondingly turns out to be $R_L=X_eX_\mu/|Z_E|-X_\mu/g_mX_\pi$.

Similar simplified relationships can be specified for a common-source field-effect transistor in the first stage of the amplifier circuit to be configured. However, because more exact models are used in practice for describing the transistor properties, which, however, are not important for understanding the invention, the specification of the corresponding relationships for a field-effect transistor is dispensed with here, and so, too, are the introduction and explanation of the more exact models.

The method according to the invention for configuring integrated low-noise amplifiers enables the construction in a simple manner in substantially two steps, the steps ultimately having practically no influence on one another. Customary external circuitry of the amplifier is not necessary because the amplifier is already optimized for the desired application, i.e., the operation at the output of a preceding transfer element with a specific output impedance.

I claim:

1. A method for producing a low-noise integrated amplifier circuit, which comprises:

providing an integrated amplifier circuit having an input stage with one of the group consisting of a common-emitter bipolar transistor and a common-source field-effect transistor, each transistor having a collector with an effective load, the amplifier circuit having an input impedance, a noise figure, and integrated components with component values;

connecting a transfer element upstream with respect to the amplifier circuit, the transfer element having a predetermined output impedance with a real part; and dimensioning the amplifier circuit by:
   a) noise matching the amplifier circuit to the real part of the predetermined output impedance of the transfer element by:
      determining a range of resistances in which the noise figure of the amplifier circuit is less than a predetermined noise figure by at least one of the group consisting of:
         first defining process parameters during the production of the amplifier circuit;
         first defining geometry parameters of at least one of the integrated components of the amplifier circuit;
         a dimensioning of the component values; and
         first defining one of a collector current and a drain current;
      the noise figure of the amplifier circuit being dependent on a real generator resistance, and by determining a value of the real part of the predetermined output impedance lying in the range of resistances; and
   for the first definition of the parameters of the amplifier circuit, determining a minimum noise figure and an associated optimum generator resistance and realizing the amplifier circuit with the associated parameters if the minimum noise figure is less than or equal to the predetermined noise figure and the optimum generator resistance corresponds, within predetermined tolerances, to the real part of the predetermined output impedance, otherwise performing a new definition of the parameters, replacing the first definition, with other parameters deviating from the first definition; and
   b) subsequently, power matching the input impedance of the amplifier circuit to the predetermined output impedance by selecting the effective load on the collector of the transistor to produce a complex voltage gain generating, due to the Miller effect, an input impedance equal to a complex conjugate of the predetermined output impedance.

2. The method according to claim 1, which further comprises calculating, for an input stage with a bipolar transistor, the noise figure dependent upon at least one parameter of the group consisting of the real generator resistance, an optimum noise figure, and the optimum generator resistance to an approximation as a function of a base bulk resistance and the collector current.

3. The method according to claim 1, which further comprises calculating, for an input stage with a field-effect transistor, the noise figure dependent upon at least one parameter of the group consisting of the real generator resistance, an optimum noise figure, and the optimum generator resistance as a function of a gate-source capacitance and a drain current.

4. The method according to claim 2, which further comprises, for a common-emitter bipolar transistor, calculating the optimum noise figure $F_{opt}$ and the optimum generator resistance $R_{opt}$ with the following two approximation relationships:

$$R_{sopt} \approx \frac{\sqrt{\beta_F}}{g_m} \sqrt{1 + 2 g_m r_b} \quad F_{opt} \approx 1 + \frac{1}{\sqrt{\beta_F}} \sqrt{1 + 2 g_m r_b},$$

where $\beta_F$ designates a DC gain of the transistor, $r_b$ designates the base bulk resistance, and $g_m$ designates the transistor transconductance and the following holds true for $g_m$: $g_m = eI_c/kT$, where e designates the charge of an electron, k designates Boltzmann's constant, T designates the absolute temperature, and $I_c$ designates the collector current.

5. The method according to claim 1, which further comprises determining the power matching for a common-emitter bipolar transistor with an emitter inductance $L_e$ and a load including a series circuit formed by a capacitance $C_L$ with a resistance $X_L$ and a non-reactive resistance $R_L$, with the following relationships:

$$X_L = |1 + g_m X_e \tan\Phi| \cos\Phi \frac{X_\mu}{g_m^* |Z_E|}$$

$$R_L = \tan[\arctan(X_e g_m) - \Phi] \cdot X_L - \frac{X_\mu}{g_m \cdot X_\pi}$$

where $X_e$ designates the reactance $X_e = j\omega L_e$ of the emitter inductance, $X_\mu$ designates the reactance of the collector-base capacitance $X_\mu = -j/\omega C_\mu$, $C_\mu$ designates the collector-base capacitance, $g_m$ designates the transconductance of the transistor, $|Z_E|$ designates the magnitude, $\Phi$ designates the phase of the target input impedance $Z_\epsilon = |Z_E| \cdot e^{j\Phi}$, and $X_\pi$ designates the base-emitter impedance in a $\pi$ equivalent circuit diagram of the bipolar transistor.

6. The method according to claim 2, which further comprises determining the power matching for a common-emitter bipolar transistor with an emitter inductance $L_e$ and a load including a series circuit formed by a capacitance $C_L$ with a reactance $X_L$ and a non-reactive resistance $R_L$, with the following relationships:

$$X_L = |1 + g_m X_e \tan\Phi| \cos\Phi \frac{X_\mu}{g_m^* |Z_E|}$$

$$R_L = \tan[\arctan(X_e g_m) - \Phi] \cdot X_L - \frac{X_\mu}{g_m \cdot X_\pi}$$

where $X_e$ designates the reactance $X_e = j\omega L_e$ of the emitter inductance, $X_\mu$ designates the reactance of the collector-base capacitance $X_\mu = -j/\omega C_\mu$, $C_\mu$ designates the collector-base capacitance, $g_m$ designates the transconductance of the transistor, $|Z_E|$ designates the magnitude, $\Phi$ designates the phase of the target input impedance $Z_\epsilon = |Z_E| \cdot e^{j\Phi}$, and $X_\pi$ designates the base-emitter impedance in a $\pi$ equivalent circuit diagram of the bipolar transistor.

7. The method according to claim 4, which further comprises determining the power matching for a common-emitter bipolar transistor with an emitter inductance $L_e$ and a load including a series circuit formed by a capacitance $C_L$ with a reactance $X_L$ and a non-reactive resistance $R_L$, with the following relationships:

$$X_L = |1 + g_m X_e \tan\Phi| \cos\Phi \frac{X_\mu}{g_m^* |Z_E|}$$

$$R_L = \tan[\arctan(X_e g_m) - \Phi] \cdot X_L - \frac{X_\mu}{g_m \cdot X_\pi}$$

where $X_e$ designates the reactance $X_e = j\omega L_e$ of the emitter inductance, $X_\mu$ designates the reactance of the collector-base capacitance $X_\mu = -j/\omega C_\mu$, $C_\mu$ designates the collector-base capacitance, $g_m$ designates the transconductance of the transistor, $|Z_E|$ designates the magnitude, $\Phi$ designates the phase of the target input impedance $Z_\epsilon = |Z_E| \cdot e^{j\Phi}$, and $X_\pi$ designates the base-emitter impedance in a $\pi$ equivalent circuit diagram of the bipolar transistor.

* * * * *